(12) United States Patent
Cho

(10) Patent No.: US 12,040,008 B2
(45) Date of Patent: Jul. 16, 2024

(54) MEMORY DEVICE THAT STORES NUMBER OF ACTIVATION TIMES OF WORD LINES

(71) Applicant: SAMSUNG ELECTRONICS CO., LTD., Suwon-si (KR)

(72) Inventor: Seong-Jin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/953,068

(22) Filed: Sep. 26, 2022

(65) Prior Publication Data

US 2023/0186969 A1 Jun. 15, 2023

(30) Foreign Application Priority Data

Dec. 10, 2021 (KR) .................... 10-2021-0176858

(51) Int. Cl.
| | |
|---|---|
| *G11C 11/408* | (2006.01) |
| *G06F 12/06* | (2006.01) |
| *G11C 11/406* | (2006.01) |
| *G11C 11/4091* | (2006.01) |
| *H01L 25/18* | (2023.01) |

(52) U.S. Cl.
CPC .......... *G11C 11/4085* (2013.01); *G06F 12/06* (2013.01); *G11C 11/406* (2013.01); *G11C 11/4091* (2013.01); *H01L 25/18* (2013.01)

(58) Field of Classification Search
CPC ... G06F 12/06; G11C 11/406; G11C 11/4091; H01L 25/18
See application file for complete search history.

(56) References Cited

U.S. PATENT DOCUMENTS

| | | | |
|---|---|---|---|
| 7,313,036 B2 | 12/2007 | Kim | |
| 7,525,829 B2* | 4/2009 | Kawakita | ............ G11C 11/4097 365/51 |
| 8,477,526 B2 | 7/2013 | Rountree | |
| 8,964,494 B2 | 2/2015 | Lane et al. | |
| 10,446,216 B2 | 10/2019 | Oh et al. | |
| 2006/0109731 A1* | 5/2006 | Suh | ...................... G11C 11/4097 365/230.03 |
| 2009/0296510 A1* | 12/2009 | Lee | ...................... G11C 11/4085 365/230.03 |
| 2010/0080044 A1* | 4/2010 | Seo | ...................... G11C 11/4094 365/207 |
| 2011/0199808 A1* | 8/2011 | Yi | .......................... G11C 5/063 365/72 |

(Continued)

*Primary Examiner* — Ryan Bertram
(74) *Attorney, Agent, or Firm* — Fish & Richardson P.C.

(57) ABSTRACT

A memory device including a memory bank array which includes a first edge memory block, a second edge memory block, and a plurality of memory blocks placed between the first edge memory block and the second edge memory block; a plurality of sense amplifiers between the plurality of memory blocks, and that connect a first bit line of a memory block on one side of each of the plurality of sense amplifiers and a first complementary bit line of a memory block on an other side of each of the plurality of sense amplifiers; a first edge sense amplifier connected to a second bit line and a second complementary bit line of the first edge memory block; and a second edge sense amplifier connected to a third bit line and a third complementary bit line of the second edge memory block.

20 Claims, 15 Drawing Sheets

(56) References Cited

U.S. PATENT DOCUMENTS

| | | | |
|---|---|---|---|
| 2013/0272047 A1* | 10/2013 | Yi | G11C 7/065 |
| | | | 365/63 |
| 2016/0163365 A1* | 6/2016 | Yang | G11C 7/14 |
| | | | 365/51 |
| 2019/0228813 A1* | 7/2019 | Nale | G11C 11/4096 |
| 2020/0167216 A1 | 5/2020 | Lee et al. | |
| 2020/0349995 A1 | 11/2020 | Shore et al. | |
| 2023/0206980 A1* | 6/2023 | He | G11C 11/4091 |
| | | | 365/222 |
| 2023/0206989 A1* | 6/2023 | He | G11C 11/4087 |
| | | | 365/189.02 |

\* cited by examiner

2000

MEMORY DEVICE THAT STORES NUMBER OF ACTIVATION TIMES OF WORD LINES

CROSS-REFERENCE TO THE RELATED APPLICATION

A claim of priority under 35 U.S.C. § 119 is made to Korean Patent Application No. 10-2021-0176858 filed on Dec. 10, 2021, in the Korean Intellectual Property Office, the entirety of which is hereby incorporated by reference.

BACKGROUND

The present disclosure relates to a memory device.

As the degree of integration of memory increases, gaps between multiple word lines included in a memory decrease. As the gaps between the word lines decrease, the coupling effect between adjacent word lines increases.

On the other hand, each time data is input to or output from a memory cell, a word line toggles between an activated (active) status and a deactivated status. As described above, while the coupling effect between adjacent word lines increases, there is a phenomenon of damage to data of memory cells connected to a word line adjacent to the word line that is often activated. Such a phenomenon is called row hammering, which may result in the occurrence of a phenomenon in which the data of the memory cell is damaged before the memory cell is refreshed due to word line disturbance.

SUMMARY

Embodiments of the inventive concepts provide a memory device having improved product reliability.

Embodiments of the inventive concepts provide a memory device including a memory bank array which includes a first edge memory block, a second edge memory block, and a plurality of memory blocks between the first edge memory block and the second edge memory block; a plurality of sense amplifiers disposed between the plurality of memory blocks, each corresponding sense amplifier from among the plurality of sense amplifiers is connected to a first bit line of a memory block from among the plurality of memory blocks on one side of the corresponding sense amplifier and a first complementary bit line of a memory block from among the plurality of memory blocks on an other side of the corresponding sense amplifier; a first edge sense amplifier connected a second bit line and a second complementary bit line of the first edge memory block; and a second edge sense amplifier connected to a third bit line and a third complementary bit line of the second edge memory block.

Embodiments of the inventive concepts further provide a memory device including a plurality of memory blocks including a plurality of first word lines, and a plurality of first memory cells connected to the plurality of first word lines and that store data; a memory bank array including a first edge memory block and a second edge memory block including a plurality of second word lines, and a plurality of second memory cells connected to the plurality of second word lines and that stores the number of times of activation of each of the plurality of first word lines; and a control logic circuit that activates a third word line from among the plurality of first word lines corresponding to a row address of an active command, and a word line from among the plurality of second word lines to which a memory cell which from among the plurality of second memory cells which stores the number of times of activation of the third word line is connected, in response to the active command The first edge memory block is disposed at a first edge of the memory bank array, and the second edge memory block is disposed at a second edge of the memory bank array.

Embodiments of the inventive concepts still further provides a memory device including a memory bank array including a first edge memory block, a second edge memory block, and a plurality of memory blocks between the first edge memory block and the second edge memory block; and a control logic circuit that updates a number of times of activation of a word line corresponding to a row address of an active command stored in either the first edge memory block or the second edge memory block, in response to the active command The first edge memory block is disposed at a first edge of the memory bank array, and the second edge memory block is disposed at a second edge of the memory bank array.

BRIEF DESCRIPTION OF THE DRAWINGS

The above and other aspects and features of the present disclosure will become more apparent in view of the following detailed description of exemplary embodiments referring to the attached drawings, in which.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
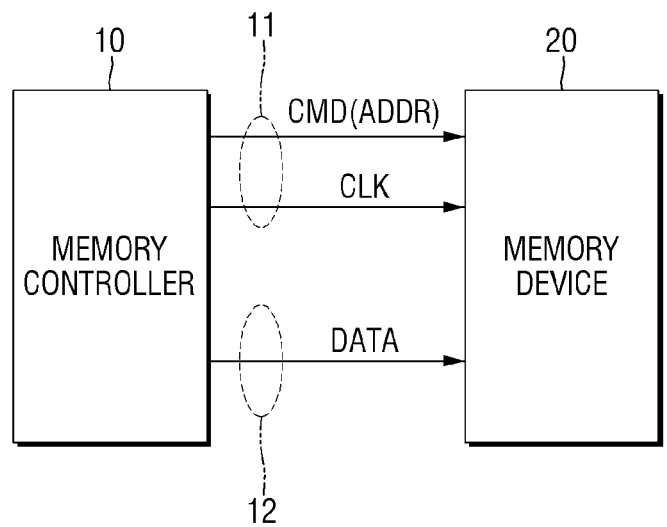
FIG. 1 illustrates a block diagram for explaining a memory system according to some embodiments of the inventive concepts.

FIG. 1 illustrates a block diagram of a memory system according to embodiments of the inventive concepts.

Referring to FIG. 1, a memory system 1 according to some embodiments may include a memory controller 10 and a memory device 20.

Each of the memory controller 10 and the memory device 20 includes an interface (not shown) for communication with each other. The interface may be connected through a control bus 11 for transmitting a command CMD, an address ADDR, a clock signal CLK, and the like, and a data bus 12 for transmitting data DATA. The command CMD may be considered to include the address ADDR. The memory controller 10 may provide the memory device 20 with, for example, a refresh command, a command for setting a mode register of the memory device 20, and the like.

The memory controller 10 may generate the command CMD for controlling the memory device 20, and the data DATA may be written to the memory device 20, or the data DATA may be read from the memory device 20, according to the control of the memory controller 10.

Figure 2:
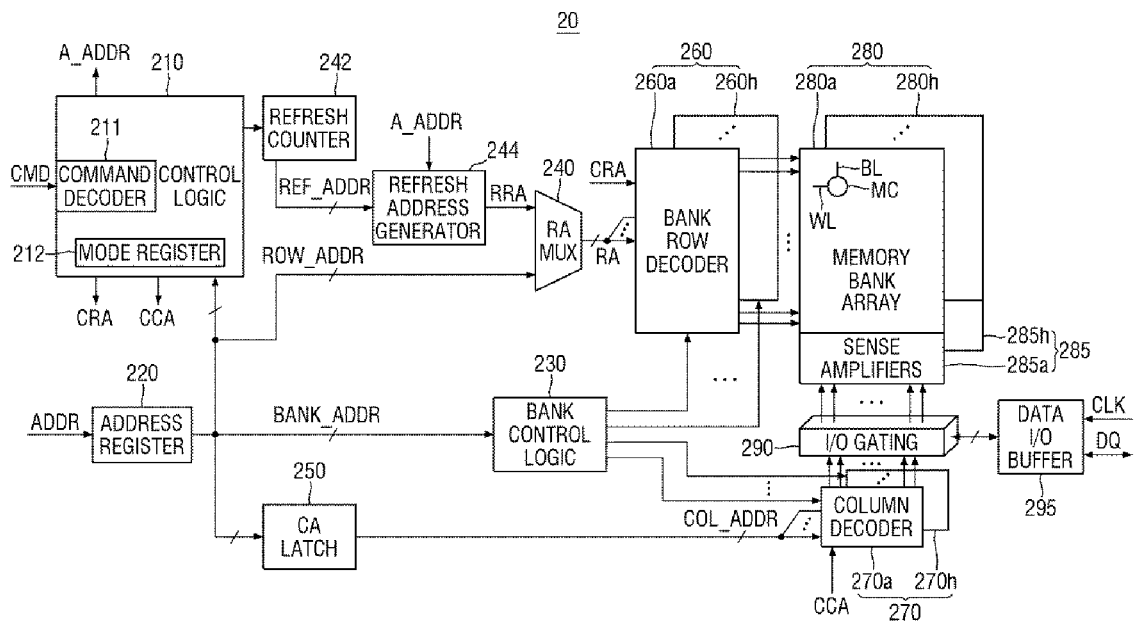
FIG. 2 illustrates a block diagram for explaining a memory device of FIG. 1.

FIG. 2 illustrates a block diagram of the memory device of FIG. 1.

Referring to FIG. 2, the memory device 20 may include a control logic 210 (e.g., a control logic circuit), an address register 220, a bank control logic 230 (e.g., a bank control logic circuit), a row address multiplexer 240, a refresh counter 242, a refresh address generator 244, a column address latch 250, a row decoder 260, a column decoder 270, a memory cell array 280, a sense amplifier 285, an I/O gating circuit 290, and a data I/O buffer 295.

The memory cell array 280 may include a plurality of memory bank arrays 280a to 280h. FIG. 2 is shown to include, but is not limited to, eight memory bank arrays 280a to 280h.

Each of the plurality of memory bank arrays 280a to 280h may include a plurality of word lines WL, a plurality of bit lines BL, and a plurality of memory cells MC formed at points at which the word lines WL and the bit lines BL intersect.

The bank row decoder 260 may include a plurality of bank row decoders 260a to 260h respectively connected to the plurality of memory bank arrays 280a to 280h. The column decoder 270 may include a plurality of column decoders 270a to 270h respectively connected to the plurality of memory bank arrays 280a to 280h. The sense amplifier 285 may include a plurality of sense amplifiers 285a to 285h respectively connected to the plurality of memory bank arrays 280a to 280h.

The address register 220 may receive an address ADDR including a bank address BANK_ADDR, a row address ROW_ADDR, and a column address COL_ADDR from the memory controller (10 of FIG. 1). The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK_ADDR. In response to such bank control signals, the bank row decoder corresponding to the bank address BANK_ADDR among the plurality of bank row decoders 260a to 260h is activated, and the bank column decoder corresponding to the bank address BANK_ADDR among the plurality of bank column decoders 270a to 270h may be activated.

The refresh counter 242 may sequentially output the target row address REF_ADDR according to the control of the control logic 210.

The row address multiplexer 240 may receive the row address ROW_ADDR from the address register 220 and receive a refresh row address RRA from the refresh address generator 244. The row address multiplexer 240 may selectively output the row address ROW_ADDR or the refresh row address RRA as the row address RA. The row address RA that is output from the row address multiplexer 240 may be applied to each of the plurality of bank row decoders 260a to 260h.

Among the plurality of bank row decoders 260a to 260h, the bank row decoder activated by the bank control logic 230 may decode the row address RA output from the row address multiplexer 240 and activate the word line corresponding to the row address. For example, the activated bank row decoder may apply a word line drive voltage to the word line corresponding to the row address.

The column address latch 250 may receive the column address COL_ADDR from the address register 220 and temporarily store the received column address COL_ADDR. The column address latch 250 may gradually increase the received column address COL_ADDR in a burst mode. The column address latch 250 may apply a temporarily stored or gradually increased column address COL_ADDR to each of the plurality of column decoders 270a to 270h.

A bank column decoder activated by the bank control logic 230 among the plurality of column decoders 270a to 270h may activate the sense amplifier corresponding to the bank address BANK_ADDR and the column address COL_ADDR through the corresponding I/O gating circuit 290.

The I/O gating circuit 290 may include input data mask logic, read data latches for storing the data output from the plurality of memory bank arrays 280a to 280h, and write drivers for writing data to the plurality of memory bank arrays 280a to 280h, together with circuits for gating the input and output data.

Data DQ to be read from one of the plurality of memory bank arrays 280a to 280h may be sensed by one of the sense amplifiers 285a to 285h corresponding to the one bank array and stored in the read data latches. The data DQ stored in the read data latches may be provided to the memory controller 10 through the data I/O buffer 295. Clock CLK may be provided to data I/O buffer 295 from the memory controller 10 for example.

The data DQ to be written on one of the plurality of memory bank arrays 280a to 280h is provided to the I/O gating circuit 290, and the I/O gating circuit 290 may write the data on one bank array through the write drivers.

The control logic 210 may control the operation of the memory device 20. For example, the control logic 210 may generate control signals so that the memory device 20 performs a write operation or a read operation. The control logic 210 may include a command decoder 211 that decodes the command CMD received from the memory controller 10, and a mode register 212 for setting the operating mode of the memory device 20 on the basis of the mode register set (MRS).

The memory device 20 may receive an active command before receiving a write command or a read command from outside (for example, the memory controller 10 of FIG. 1). All the memory cells MC connected to the word line WL of the memory device 20 may be selected on the basis of the active command After that, when the memory device 20 receives the write command or the read command, a plurality of bit lines BL may be selected. Data input and output may be performed in the memory cells MC connected to the selected bit line BL.

On the other hand, the memory cell MC may be, for example, a DRAM memory cell. The memory cell MC may be connected to each of one word line WL and one bit line BL. The memory cell MC may store charges through a cell capacitor. Since the memory cell MC generates a leakage current due to the structure of the memory cell MC, the data stored in the cell capacitor may be lost.

Therefore, the memory device 20 may perform a refresh operation for recharging the data in the memory cell MC to prevent the data stored in the memory cell MC from being changed by the leakage current.

The refresh operation includes an auto-refresh, a self-refresh, and the like. The auto-refresh refers to a mode in which the memory device 20 performs the refresh operation in accordance with a refresh command applied from the outside, and the self-refresh refers to a mode in which the memory device 20 autonomously performs the refresh operation, while sequentially changing the internal address in accordance with the refresh command applied from the outside.

In recent years, in addition to a normal refresh operation, an additional refresh operation has been performed on a memory cell of a specific word line in which data is likely to be lost due to a row hammering phenomenon. The row hammering phenomenon refers to a phenomenon in which data of the memory cell connected to the corresponding word line or an adjacent word line is damaged due to a high number of times of activations.

In order to prevent such a row hammering phenomenon, an additional refresh operation is performed on the word line that is activated more than a predetermined number of times. This is usually referred to as target-row refresh (TRR) operation. The number of times of activation of each word line may be counted to perform the target-row refresh operation.

In some embodiments, the memory cell array 280 may store the number of times of activation of each of all the word lines WL included in the memory cell array 280. For example, the control logic 210 may update the number of times of activation of the word line corresponding to the row address included in the active command in response to the active command Therefore, the control logic 210 may generate a plurality of control signals CRA and CCA. Hereinafter, a detailed description will be provided referring to FIG. 5.

In some embodiments, when the number of times of activation of the word line WL exceeds a threshold value, the control logic 210 may provide the refresh address generator 244 with a row address A_ADDR corresponding to the word line WL. The refresh address generator 244 may output the row address A_ADDR as the refresh row address RRA. As a result, a refresh operation (that is, a target refresh operation) may be performed on the row address A_ADDR. The threshold value may be the same or different for each word line.

Therefore, since the memory device 20 according to some embodiments stores the number of times of activation of each of all the word lines WL and performs the refresh operation, the reliability can be further improved.

Figure 3:
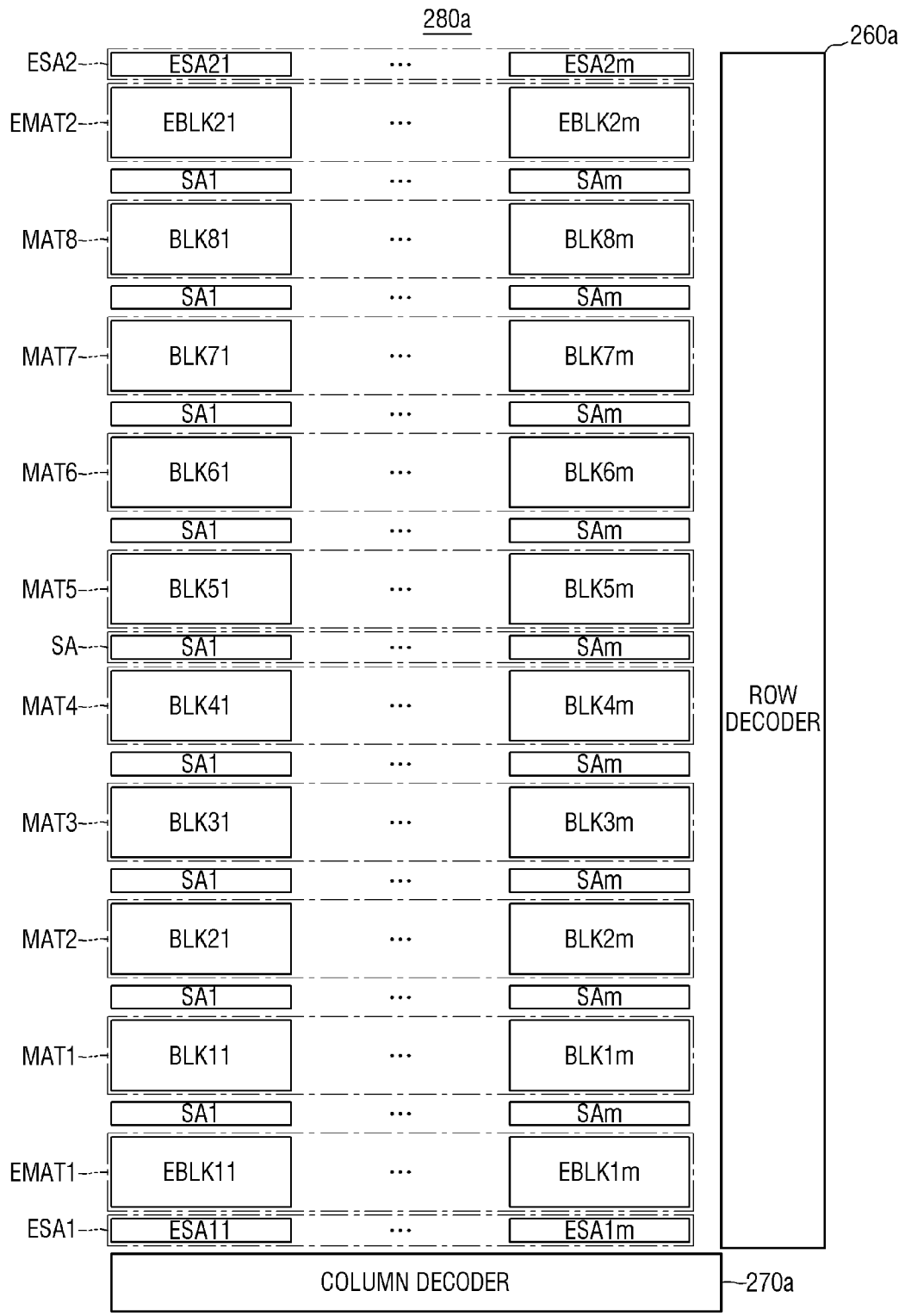
FIG. 3 illustrates a plan view of a memory bank array of FIG. 2.

FIG. 3 illustrates a plan view of the memory bank array of FIG. 2.

A memory bank array 280a, a row decoder 260a, and a column decoder 270a of FIG. 2 will be described as an example. Descriptions of the memory bank array 280a, the row decoder 260a, and the column decoder 270a may be applied to the memory bank arrays 280b to 280h, the row decoders 260b to 260h, and the column decoders 270b to 270h of FIG. 2 in the same manner.

Referring to FIG. 3, in the memory device according to some embodiments, the memory bank array 280a may be placed between the row decoder 260a and the column decoder 270a. The row decoder 260a and the column decoder 270a may surround the memory bank array 280a.

The memory bank array 280a may include a plurality of first sense amplifiers SA (e.g., SA1 to SAm), a first edge sense amplifier ESA1 (e.g., ESA11 to ESA1m), a second edge sense amplifier ESA2 (e.g., ESA21 to ESA2m), a plurality of mats MAT1 to MAT8, a first edge mat EMAT1, and a second edge matte EMAT2.

A first edge mat EMAT1 may be placed at a first edge of the memory bank array 280a. A second edge mat EMAT2 may be placed at a second edge of the memory bank array 280a. The first edge and the second edge may be opposite to each other. That is, the first edge mat EMAT1 and the second edge mat EMAT2 may be mats that are placed outside the memory bank array 280a.

The first edge mat EMAT1 may include a plurality of first edge memory blocks EBLK11 to EBLK1m arranged in one direction. The second edge mat EMAT2 may include a plurality of second edge memory blocks EBLK21 to EBLK2m arranged in one direction.

The plurality of mats MAT1 to MAT8 may be placed between the first edge mat EMAT1 and the second edge mat EMAT2. FIG. 3 is shown to include, but is not limited to, eight mats (MAT1 to MAT8).

A first mat MAT1 may include a plurality of first memory blocks BLK11 to BLK1m arranged in one direction, a second mat MAT2 may include a plurality of second memory blocks BLK21 to BLK2m arranged in one direction, a third mat MAT3 may include a plurality of third memory blocks BLK31 to BLK3m arranged in one direction, a fourth mat MAT4 may include a plurality of fourth memory blocks BLK41 to BLK4m arranged in one direction, a fifth mat MAT5 may include a plurality of fifth memory blocks BLK51 to BLK5m arranged in one direction, a sixth mat MAT6 may include a plurality of sixth memory blocks BLK61 to BLK6m arranged in one direction, a seventh mat MATT may include a plurality of seventh memory blocks BLK71 to BLK7m arranged in one direction, and an eighth mat MAT8 may include a plurality of eighth memory blocks BLK81 to BLK8m arranged in one direction.

The first edge sense amplifier ESA1 may be placed on one side of the first edge mat EMAT1. The first edge sense amplifier ESA1 may be placed between the first edge mat EMAT1 and the column decoder 270a. The first edge sense amplifier ESA1 may include a plurality of first edge sense amplifiers ESA11 to ESA1*m* arranged in one direction. The first edge sense amplifier ESA1 may be connected to the first edge mat EMAT1.

The second edge sense amplifier ESA2 may be placed on the other side of the second edge mat EMAT2. The second edge sense amplifier ESA2 may include a plurality of second sense amplifiers ESA21 to ESA2*m* arranged in one direction. The second edge sense amplifier ESA2 may be connected to the second edge mat EMAT2.

The plurality of sense amplifiers SA may be placed between the plurality of mats MAT1 to MAT8. The plurality of sense amplifiers SA may be placed between the mats MAT1 to MAT8 adjacent to each other. The sense amplifier SA may be placed between the first edge mat EMAT1 and the mat MAT1 adjacent to the first edge mat EMAT1. The sense amplifier SA may be placed between the second edge mat EMAT2 and the mat MAT8 adjacent to the second edge mat EMAT2.

Each sense amplifier SA may include a plurality of sense amplifiers SA1 to SA*m* arranged in one direction. Each sense amplifier SA may be connected to mats MAT1 to MAT8 placed on one side of the sense amplifier SA and mats MAT1 to MAT8 placed on the other side. The mats MAT1 to MAT8 adjacent to each other may share the sense amplifier SA placed between them. For example, the first memory block BLK11 and the second memory block BLK21 may share the first sense amplifier SA1 placed between them.

The first edge mat EMAT1 and the first mat MAT1 adjacent to the first edge mat EMAT1 may share the sense amplifier SA placed between them. For example, the first edge memory block EBLK11 and the first memory block BLK11 may share the first sense amplifier SA1 placed between them. The second edge mat EMAT2 and the eighth mat MAT8 adjacent to the second edge mat EMAT2 may share the sense amplifier SA placed between them. For example, the second edge memory block EBLK21 and the eighth memory block BLK81 adjacent to the second edge memory block BLK21 may share the sense amplifier SA placed between them.

Figure 4:
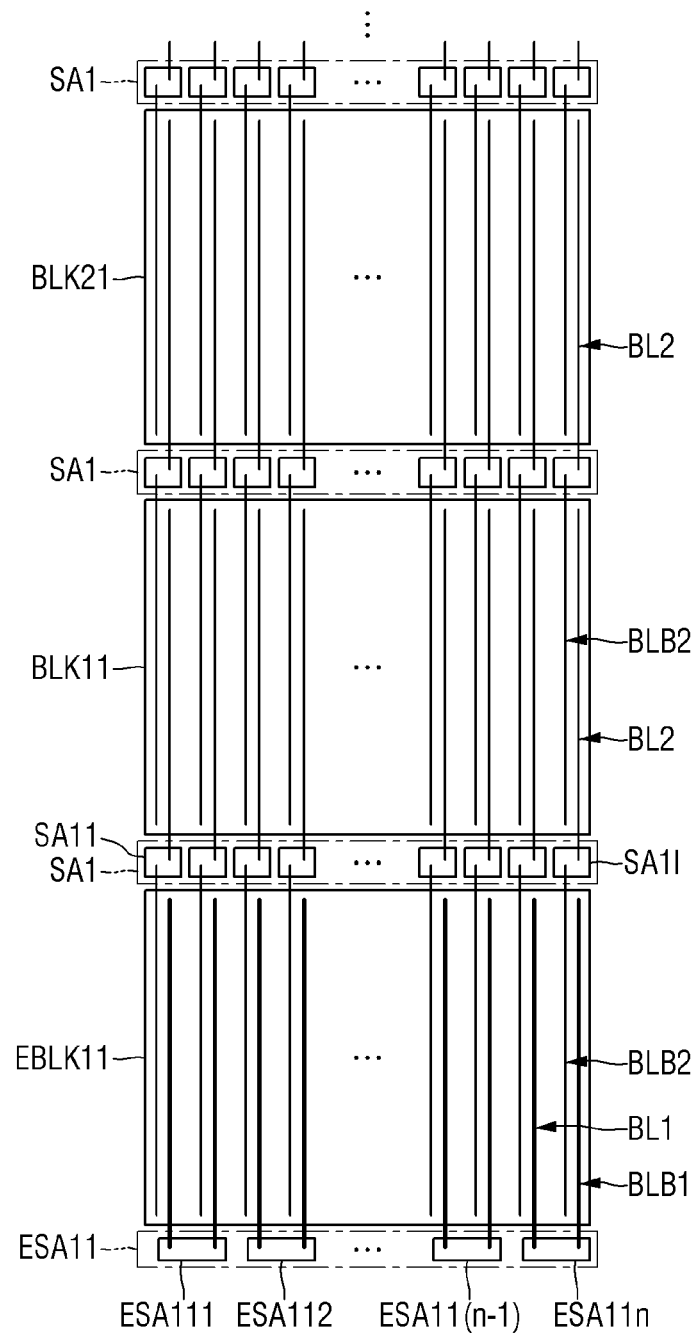
FIGS. 4 and 5 illustrate diagrams which taken together are explanatory of a memory block of FIG. 3.
Figure 5:
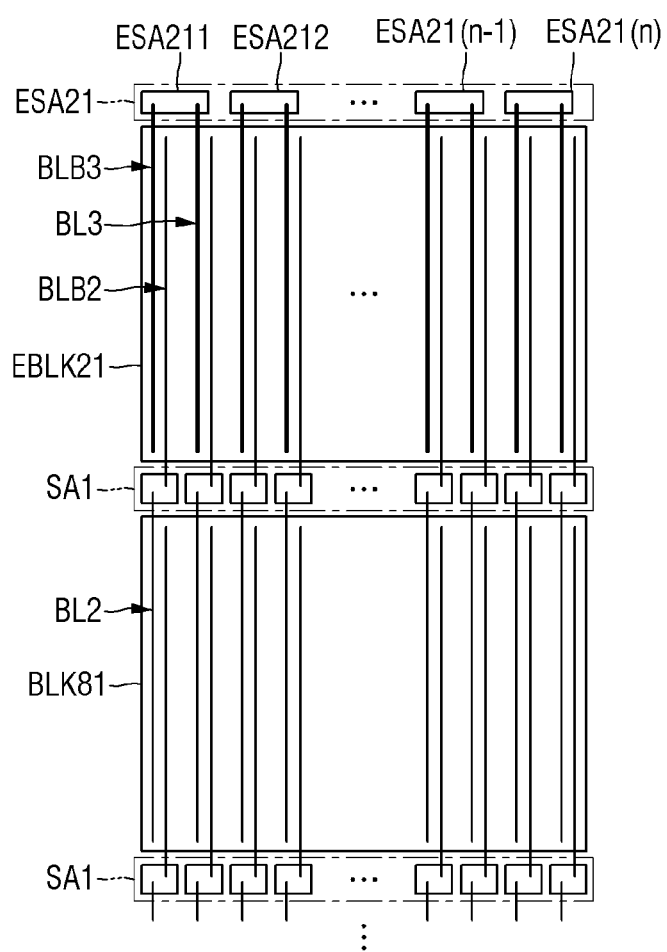

FIGS. 4 and 5 illustrate diagrams which taken together are explanatory of a memory block of FIG. 3.

FIGS. 4 and 5 will be described referring to the first to eighth memory blocks BLK11 to BLK81, the first edge memory block EBLK11, and the second edge memory block EBLK21 in FIG. 3 as an example. The description of the first to eighth memory blocks BLK11 to BLK81, the first edge memory block EBLK11 and the second edge memory block EBLK21 may also be applied to the remaining first to eighth memory blocks, the remaining first edge memory blocks and the remaining second edge memory blocks of FIG. 3.

Referring to FIGS. 4 and 5, in a memory device according to some embodiments, the memory bank array may include a memory block having a folded bit line structure, and a memory block having an open bit line structure.

Specifically, the first edge sense amplifier ESA11 may be connected to a plurality of first bit lines BL1 and a plurality of first complementary bit lines BLB1 included in the first edge memory block EBLK11. The first edge sense amplifier ESA11 may perform the read or write operation on the memory cells included in each first edge memory block BLK11.

The first edge sense amplifier ESA11 may include a plurality of first edge sense amplifiers ESA111 to ESA11*n*. Each of the first edge sense amplifiers ESA111 to ESA11*n* may be connected to a first bit line BL1 and a first complementary bit line BLB1.

That is, the plurality of first bit lines BL1 and the plurality of first complementary bit lines BLB1 connected to the first edge sense amplifier ESA11 may have a folded bit line structure.

The sense amplifier SA1 may be connected to a plurality of second bit lines BL2 included in the memory blocks BLK11 to BLK81 placed on one side of the sense amplifier SA1 and a plurality of second complementary bit lines SA1 and a plurality of second complementary bit lines BLB2 placed on the other side of the sense amplifier SAE The sense amplifier SA1 may include a plurality of sense amplifiers SA11 to SA1l. Each of the sense amplifiers SA11 to SA1l may be connected to a second bit line BL and a second complementary bit line BLB2.

For example, a sense amplifier SA11 between the first edge memory block EBLK11 and the first memory block BLK11 may be connected to a second complementary bit line BLB2 included in the first edge memory block EBLK11 and a second bit line BL2 included in the first memory block BLK11. The sense amplifier SA11 between the first memory block BLK11 and the second memory block BLK21 may be connected to a second complementary bit line BLB2 included in the first memory block BLK11 and a second bit line BL2 included in the second memory block BLK21. The sense amplifier SA11 between the first memory block BLK11 and the second memory block BLK21 may perform the read or write operation on a memory cell included in the first memory block BLK11 and a memory cell included in the second memory block BLK21. At this time, 1 may be larger than n. Also, n is twice 1.

That is, the plurality of second bit lines BL2 and the plurality of second complementary bit lines BLB2 connected to the sense amplifier SA1 may have an open bit line structure.

The second edge sense amplifier ESA21 may be connected to a plurality of third bit lines BL3 and a plurality of third complementary bit lines BLB3 included in the second edge memory block EBLK21. The second edge sense amplifier ESA21 may perform the read or write operation on the memory cells included in the second edge memory block EBLK21.

The second edge sense amplifier ESA21 may include a plurality of second edge sense amplifiers ESA211 to ESA21*n*. Each of the second edge sense amplifiers ESA211 to ESA21*n* may be connected to a third bit line BL3 and a third complementary bit line BLB3.

That is, the plurality of third bit lines BL3 and the plurality of third complementary bit lines BLB3 connected to the second edge sense amplifier ESA21 may have a folded bit line structure.

When a memory bank array has an open bit line structure, the bit line included in the memory block placed at the edge of the memory bank array is a dummy bit line in which no data is stored. That is, when the memory bank array has an open bit line structure, the memory device may include unnecessary mats (e.g., first and second edge mats EMAT1 and EMAT2 such as in FIG. 3) depending on the characteristics of the structure.

In the memory device according to some embodiments of the inventive concepts, the first edge memory block EBLK11 placed at the edge of the memory bank array may include a first bit line BL1 and a first complementary bit line BLB1 having a folded bit line structure, and the second edge memory block EBLK21 may include a third bit line BL3 and a third complementary bit line BLB13 having a folded bit line structure. The memory cells included in the first to eighth memory blocks BLK11 to BLK81 may store data, and the memory cells included in the first edge memory block EBLK11 and the second edge memory block EBLK21 may store the number of times of activation of each word line. That is, the memory device according to some embodiments may utilize the conventional dummy region as a region for storing the number of times of activation of each word line. Therefore, even if the area of the memory device does not significantly increase, all the word lines may each store the number of times of activation.

Further, the first edge memory block EBLK11 and the second edge memory block EBLK21 are able to perform the read operation and the write operation through separate first edge sense amplifier ESA11 and second edge sense amplifier ESA21. Therefore, the read or write operation on the memory cells included in the first to eighth memory blocks BLK11 to BLK81 may be performed independently of the read or write operation on the memory cells included in the first edge memory block EBLK11 and the second edge memory block EBLK21. That is, the read or write operation on the memory cells included in the first to eighth memory blocks BLK11 to BLK81 may be performed at the same time as the read or write operation on the memory cells included in the first edge memory block EBLK11 and the second edge memory block EBLK21. Accordingly, it is possible to prevent a decrease in bandwidth of the memory device due to the storage of the number of times of activation for each word line.

FIGS. 6, 7, 8, 9 and 10 illustrate diagrams which taken together are explanatory of the operation of the memory device according to some embodiments of the inventive concepts.

Figure 6:
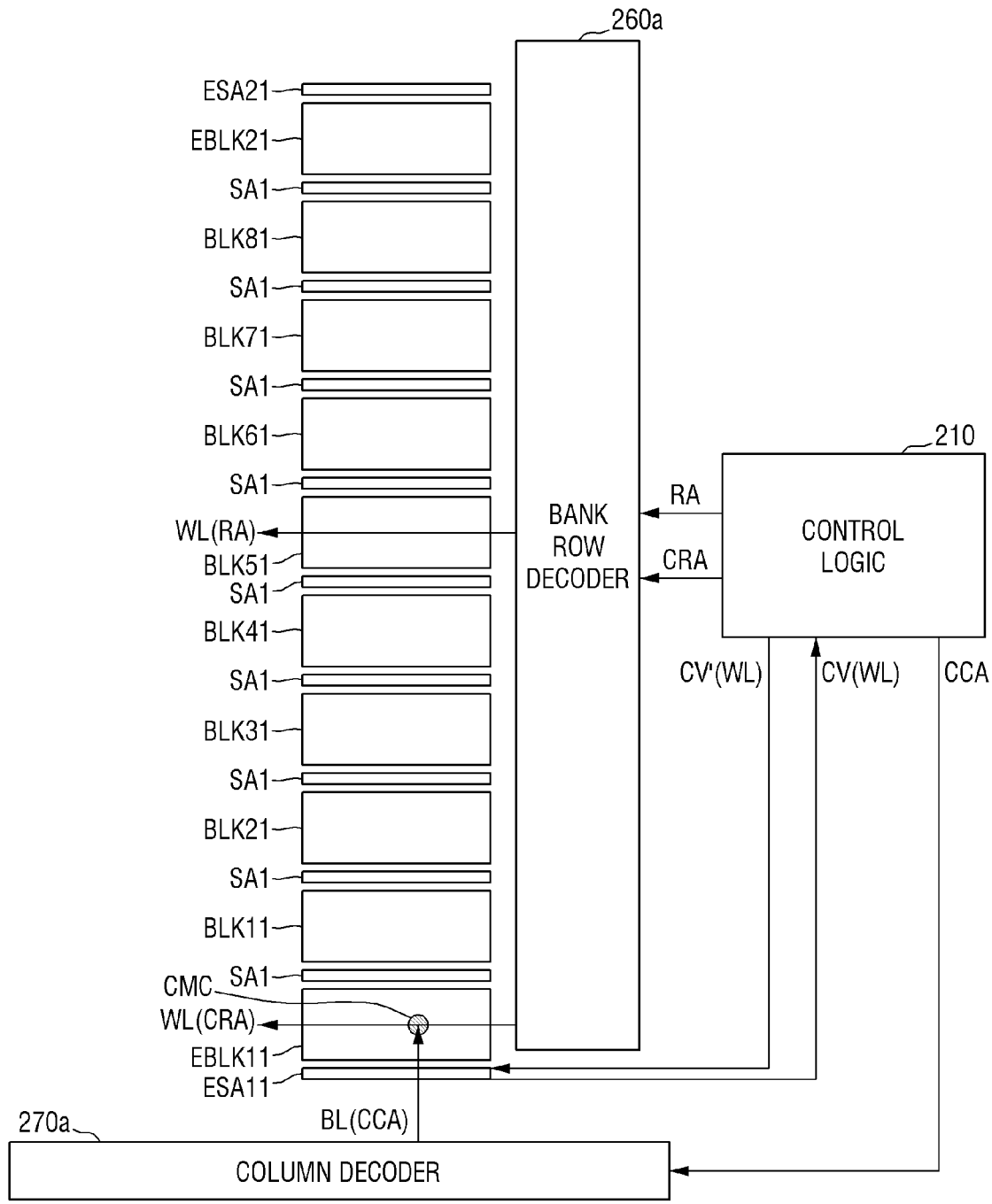
FIGS. 6, 7, 8, 9 and 10 illustrate diagrams which taken together are explanatory of the operation of the memory device according to some embodiments of the inventive concepts.

Referring to FIG. 6, the control logic 210 may activate the word line WL (RA) corresponding to the row address RA included in the active command in response to the active command A bank row decoder 260a may activate the word line WL (RA) corresponding to the row address RA.

The control logic 210 may store the address in the memory bank array in which the number of times of activation of each word line is stored. The control logic 210 may activate the word line WL (CRA) corresponding to the address in which the number of times of activation CV of the word line WL (RA) is stored, in response to the active command.

For example, the number of times of activation CV of the word line WL (RA) may be stored in the memory cell CMC of the first edge memory block EBLK11. The memory cell CMC may be connected to the word line WL (CRA) and the bit line BL (CCA). The word line WL (CRA) may correspond to the row address CRA, and the bit line BL (CCA) may correspond to the column address CCA. The control logic 210 may provide the row address CRA to the bank row decoder 260a in response to the active command. The bank row decoder 260a may activate the word line WL (CRA) corresponding to the row address CRA.

The control logic 210 may provide the bank column decoder 270a with the column address CCA in which the number of times of activation CV is stored. The bank column decoder 270a may select the bit line BL (CCA) corresponding to the column address CCA. The first edge sense amplifier ESA11 may read the number of times of activation CV from the memory cell CMC connected to the word line WL (CRA) and the bit line BL (CCA). The control logic 210 may be provided with the number of times of activation CV (e.g., CV(WL)) from the first edge sense amplifier ESA11.

The control logic 210 may update the number of times of activation CV. The control logic 210 may, for example, increase the number of times of activation CV by 1 to generate the number of times of activation CV'.

The control logic 210 may write the number of times of activation CV' (e.g., CV' (WL)) on the memory cell CMC again. The control logic 210 may provide the number of times of activation CV' to the first edge sense amplifier ESA11. The first edge sense amplifier ESA11 may write the number of times of activation CV' on the memory cell CMC connected to the word line WL (CRA) and the bit line BL (CCA).

Figure 7:
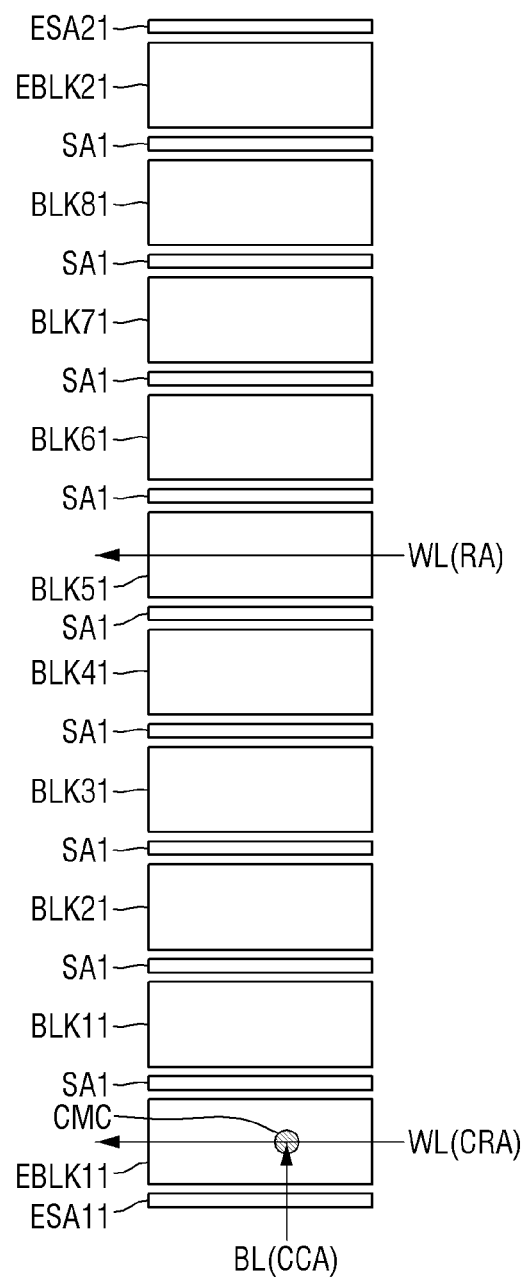

Referring to FIG. 7, in the memory device according to some embodiments, the number of times of activation of the word lines included in the memory blocks BLK21 to BLK71 not adjacent to the first edge memory block EBLK11 and the second edge memory block EBLK21 may be stored in the memory cell included in the first edge memory block EBLK11 or the memory cell included in the second edge memory block EBLK21. That is, the number of times of activation of each word line may be stored in the edge memory blocks EBLK11 and EBLK21 which are not adjacent to the memory blocks BLK11 to BLK81 including the word line, among the first edge memory block EBLK11 and the second edge memory block EBLK21.

For example, the number of times of activation of the word line WL (RA) included in the fifth memory block BLK51 may be stored in the memory cell CMC included in the first edge memory block EBLK11.

In response to the active command, the word line WL (RA) corresponding to the row address RA included in the active command, and the word line WL (CRA) corresponding to the address in which the number of times of activation of the word line WL (RA) is stored may be activated. The bit line BL (CCA) corresponding to the address which stores the number of times of activation of the word line WL (RA) is selected, and the number of times of activation of the word line WL (RA) may be read from the memory cell CMC. The number of times of activation is updated, and the updated number of times of activation may be written on the memory cell CMC.

At this time, since the word line WL (CRA) and the word line WL (RA) are included in the first edge memory block EBLK11 and the fifth memory block BLK 51 which are not adjacent to each other, even if the word line WL (CRA) and the word line WL (RA) are activated at the same time, a disturbance does not occur. Therefore, in some embodiments, the word line WL (CRA) may be activated at the same time as the word line WL (RA).

Similarly, the number of times of activation of each word line included in the second to fourth memory blocks BLK21 to BLK41 and the sixth and seventh memory blocks BLK61 and BLK71 may be stored in the first edge memory block EBLK11 or the second edge memory block EBLK21.

Figure 8:
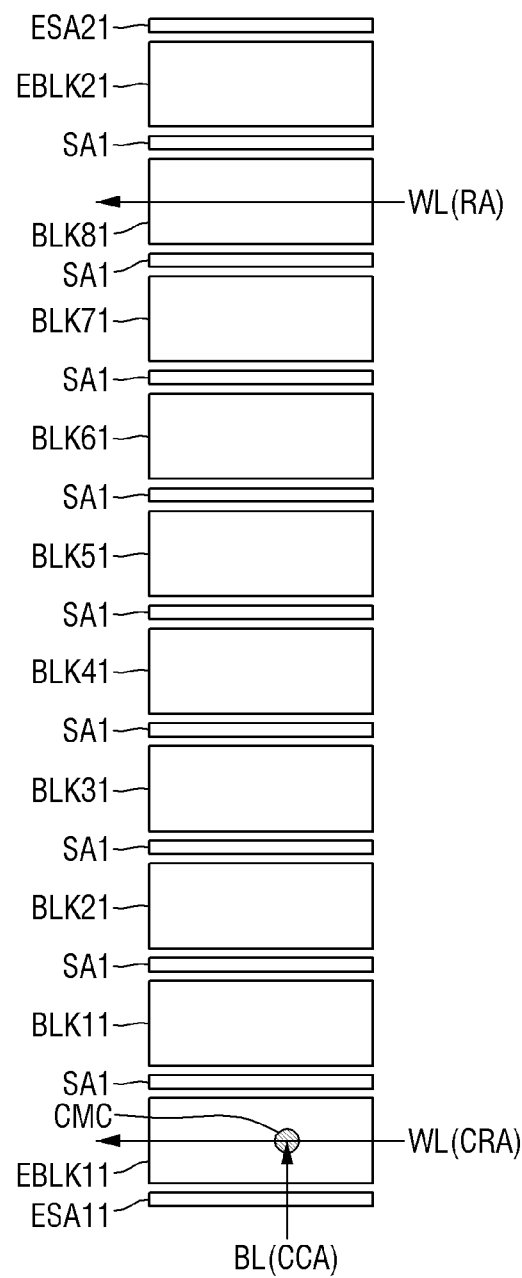
Figure 9:
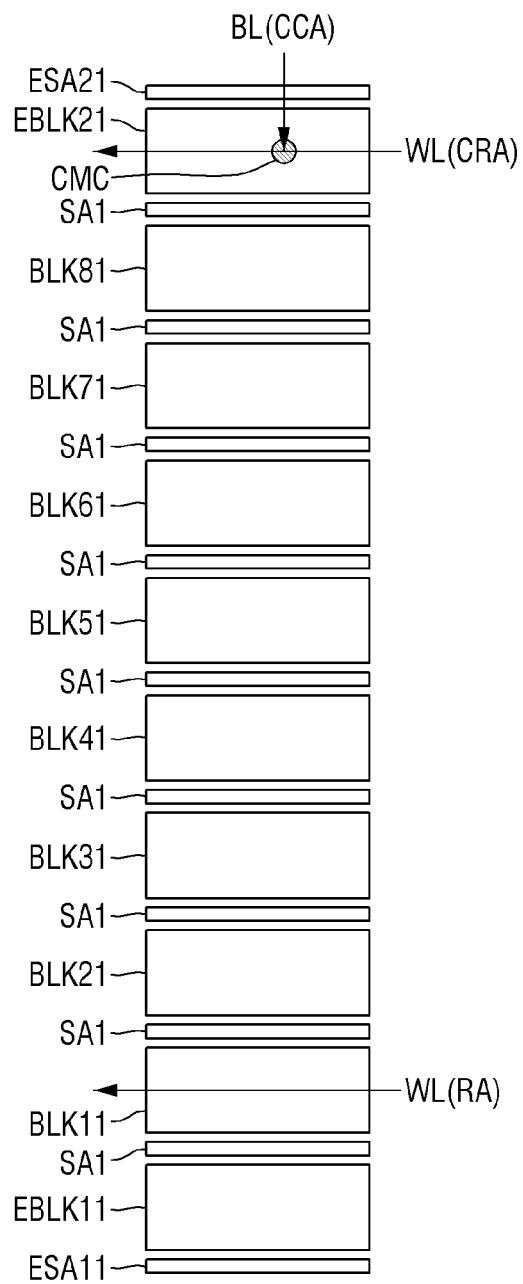

Referring to FIGS. 8 and 9, in the memory device according to some embodiments, the number of times of activation of the word lines included in the memory blocks BLK11 and BLK81 adjacent to the first edge memory block EBLK11 or the second edge memory block EBLK21 may be stored in the first edge memory block EBLK11 or the second edge memory block EBLK21 that are not adjacent to the memory blocks BLK11 and BLK81.

For example, referring to FIG. 8, the number of times of activation of the word line WL (RA) included in the eighth memory block BLK81 adjacent to the second edge memory block EBLK21 may be stored in the memory cell CMC included in the first edge memory block EBLK11.

For example, referring to FIG. 9, the number of times of activation of the word line WL (RA) included in the first memory block BLK11 adjacent to the first edge memory block EBLK11 may be stored in the memory cell CMC included in the second edge memory block EBLK21.

At this time, since the word line WL (CRA) and the word line WL (RA) are included in the first edge memory block EBLK11 and the eighth memory block BLK81 which are not adjacent to each other, as described above, even if the word line WL (CRA) and the word line WL (RA) are activated at the same time, a disturbance does not occur. Therefore, in some embodiments, the word line WL (CRA) may be activated at the same time as the word line WL (RA).

Further, since the first edge memory block EBLK11 and the second edge memory block EBLK21 are connected to each of the separate first edge sense amplifier ESA11 and the second edge sense amplifier ESA21, the read or write operation on the memory cells of the first and second edge memory blocks EBLK11 and EBLK21 may be performed independently of the read or write operation on the memory cells included in the first and eighth memory blocks BLK11 and BLK81.

The number of times of activation of each word line in the second to seventh memory blocks BLK21 to BLK71 may be stored in the first edge memory block EBLK11 or the second edge memory block EBLK21 as described above.

Figure 10:
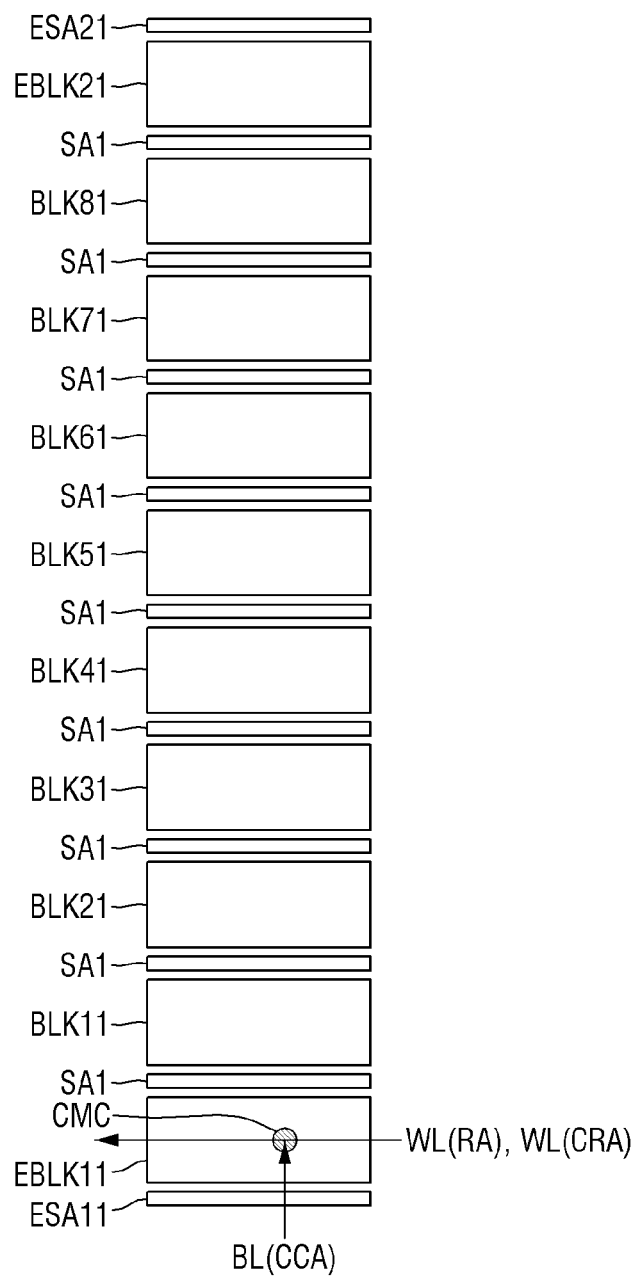

Referring to FIG. 10, in the memory device according to some embodiments, the number of times of activation of the word line included in the first edge memory block EBLK11 may be stored in the memory cell included in the first edge memory block EBLK11.

For example, the number of times of activation of the word line WL (RA) included in the first edge memory block EBLK11 may be stored in the memory cell CMC included in the first edge memory block EBLK11. The memory cell CMC may be connected to the word line WL (CRA) and the bit line BL (CCA). At this time, the word line WL (CRA) may be the same as the word line WL (RA). That is, the number of times of activation of the word line included in the first edge memory block EBLK11 may be stored in the memory cell connected to the word line.

Similarly, the number of times of activation of the word line included in the second edge memory block EBLK21 may be stored in the memory cell connected to the word line.

As described above, the number of times of activation of each word line in the first memory block BLK11 may be stored in the second edge memory block EBLK21, the number of times of activation of each word line in the eighth memory block BLK81 may be stored in the first edge memory block EBLK11, and the number of times of activation of each word line in the second to seventh memory blocks BLK21 to BLK71 may be stored in the first edge memory block EBLK11 or the second edge memory block EBLK21.

Figure 11:
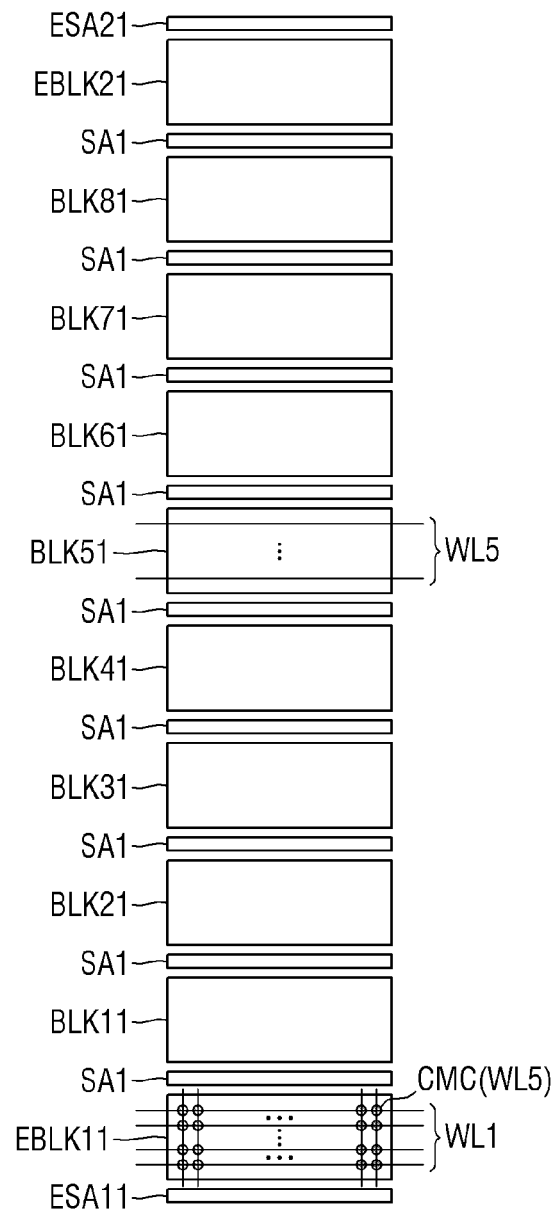
FIGS. 11 and 12 illustrate diagrams which taken together are explanatory of operation of the memory device according to some embodiments of the inventive concepts.
Figure 12:
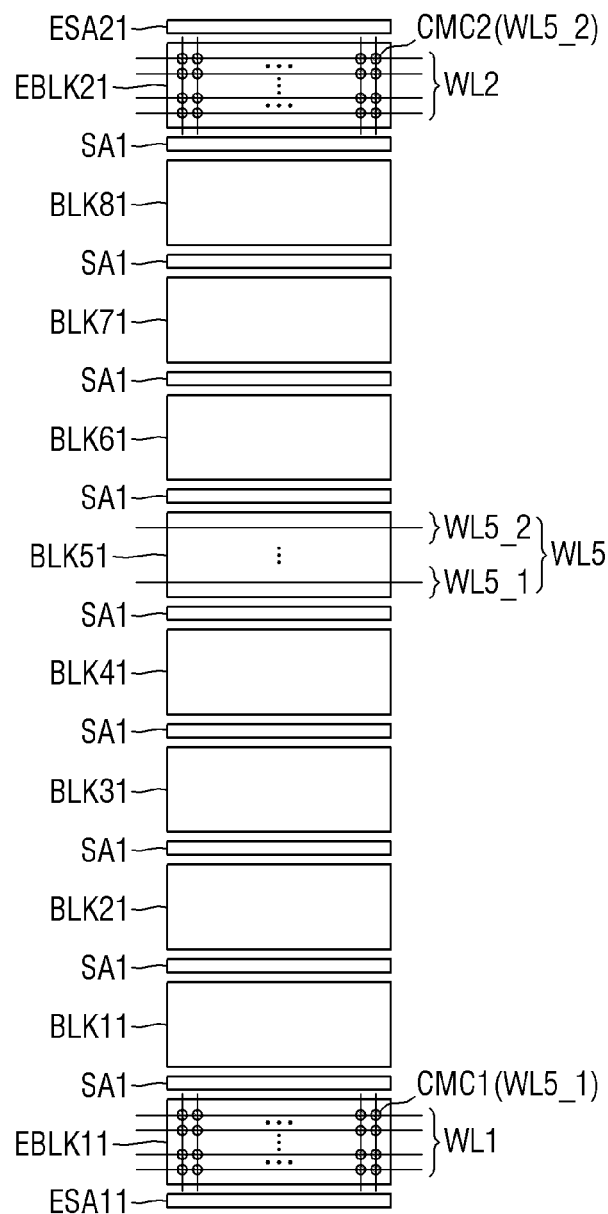

FIGS. 11 and 12 illustrate diagrams which taken together are explanatory of the operation of the memory device according to some embodiments of the inventive concepts. For convenience of explanation, the points different from those described with respect to FIGS. 6 to 10 will be mainly described hereinafter.

Referring to FIG. 11, in the memory device according to some embodiments, the number of times of activation of each word line included in any one of the memory blocks BLK11 to BLK81 may be stored in one of the edge memory blocks EBLK11 and EBLK21.

For example, the fifth memory block BLK51 may include a plurality of word lines WL5. The first edge memory block EBLK11 may include a plurality of word lines WL1. The number of times of activation of each word line WL5 may be stored in a memory cell CMC (WL5) connected to the plurality of word lines WL1.

Referring to FIG. 12, in the memory device according to some embodiments, a part of the number of times of activation of each word line included in any one of the memory blocks BLK11 to BLK81 may be stored in the first edge memory block EBLK11, and the rest (i.e., a remaining part) may be stored in the second edge memory block EBLK21.

For example, the fifth memory block BLK51 may include a plurality of word lines WL5. The first edge memory block EBLK11 may include a plurality of word lines WL1. The second edge memory block EBLK21 may include a plurality of word lines WL2. The number of times of activation of each of a part WL5_1 of the plurality of word lines WL5 may be stored in the memory cell CMC1 (WL5_1) of the first edge memory block EBLK11. The part WL5_1 may include a plurality of word lines. The number of times of activation of each of the rest WL5_2 of the plurality of word lines WL5 may be stored in the memory cell CMC_1 (WL5_2) of the second edge memory block EBLK21. The part WL5_2 may include a plurality of word lines.

The word line WL5_1 and the word line WL5_2 may be variously placed inside the fifth memory block BLK51. For example, the word line WL5_1 and the word line WL5_2 may be alternately placed inside the fifth memory block BLK51. For example, the word line WL5_1 may be placed on one side of the fifth memory block BLK51, and the word line WL5_2 may be placed on the other side of the fifth memory block BLK51, but is not limited thereto.

The number of times of activation of each word line included in the first to fourth memory blocks BLK11 to BLK41 and the sixth to eighth memory blocks BLK61 to BLK81 may be stored as shown in FIG. 11, and may be stored as shown in FIG. 12.

Figure 13:
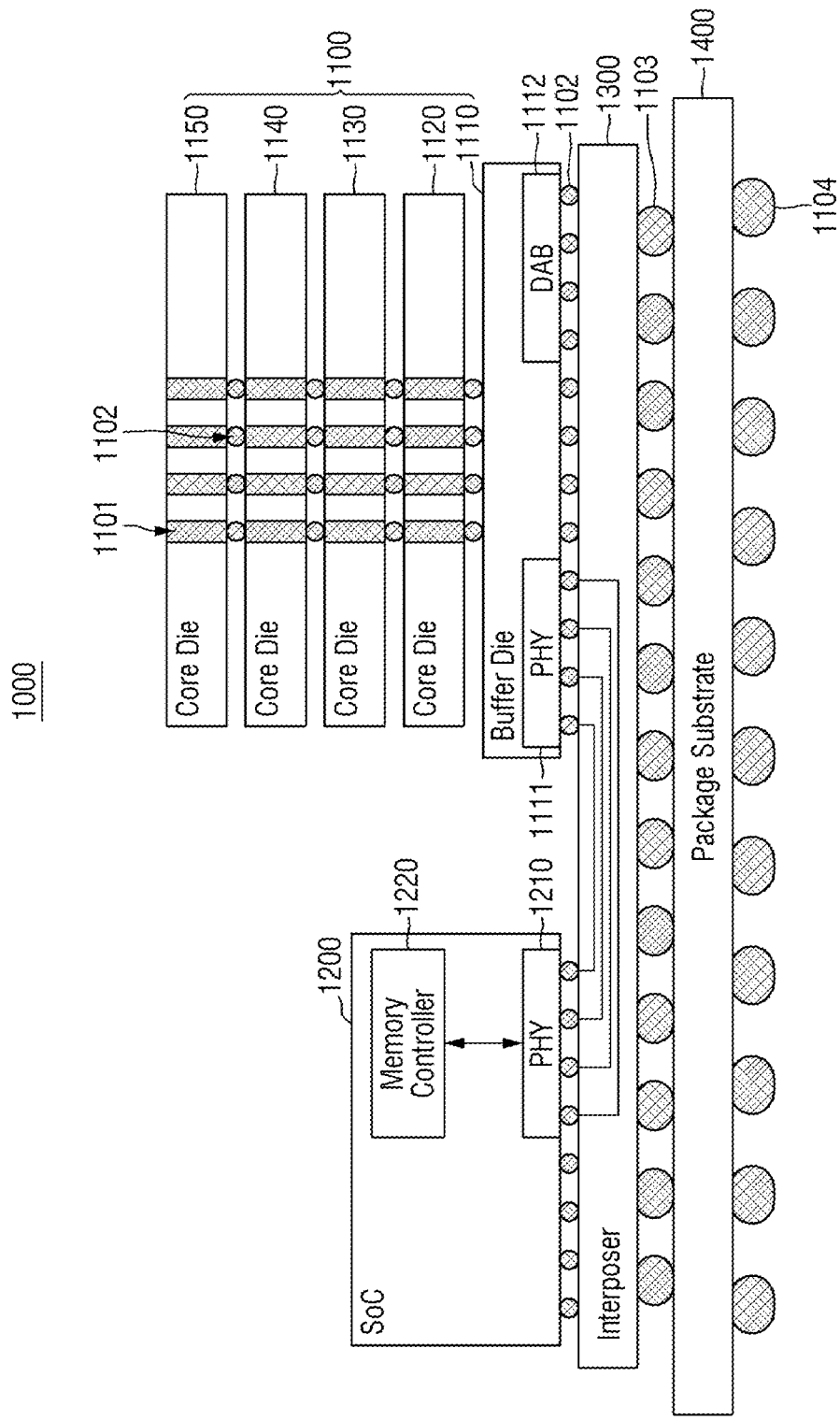
FIG. 13 illustrates a diagram of a semiconductor package according to some embodiments of the inventive concepts.

FIG. 13 illustrates a diagram of a semiconductor package according to some embodiments of the inventive concepts of the inventive concepts.

Referring to FIG. 13, a semiconductor package 1000 may include a stacked memory device 1100, a system-on-chip 1200, an interposer 1300, and a package substrate 1400. The stacked memory device 1100 may include a buffer die 1110 and core dies 1120 to 1150.

Each of the core dies 1120 to 1150 may include a memory cell array. The core dies 1120 to 1150 may include the memory device 20 described referring to FIGS. 1 to 12. The buffer die 1110 may include a physical layer (PHY) 1111 and a direct access region (DAB) 1112. The physical layer 1111 may be electrically connected to the physical layer 1210 of the system-on-chip 1200 through the interposer 1300. The stacked memory device 1100 may receive signals from the system-on-chip 1200 or transmit signals to the system-on-chip 1200 through the physical layer 1111.

The direct access region 1112 may provide an access path that may test the stacked memory device 1100 without going through the system-on-chip 1200. The direct access region 1112 may include conductive means (e.g., ports or pins) that may directly communicate with an external test device. Test signals and data received through the direct access region 1112 may be transmitted to the core dies 1120 to 1150 through the TSVs 1101. The data read from the core dies 1120 to 1150 for testing the core dies 1120 to 1150 may be transmitted to the test device through the TSVs 1101 and the direct access region 1112. Accordingly, a direct access test on the core dies 1120 to 1150 may be performed.

The buffer die 1110 and the core dies 1120 to 1150 may be electrically connected to each other through the TSVs 1101 and the bumps 1102. The buffer die 1110 may receive the signals provided to each channel from the system-on-chip 1200 through the bump 1102 assigned for each channel. For example, the bumps 1102 may be micro bumps.

The system-on-chip 1200 may execute the applications supported by the semiconductor package 1000, using the stacked memory device 1100. For example, the system-on-chip 1200 may include at least one processor of a CPU (Central Processing Unit), an AP (Application Processor), a GPU (Graphic Processing Unit), an NPU (Neural Processing Unit), a TPU (Tensor Processing Unit), a VPU (Vision Processing Unit), an ISP (Image Signal Processor), and a DSP (Digital Signal Processor) to execute specialized computations.

The system-on-chip 1200 may include a physical layer 1210 and a memory controller 1220. The physical layer 1210 may include I/O circuits for transmitting and receiving signals to and from the physical layer 1111 of the stacked memory device 1100. The system-on-chip 1200 may provide various signals to the physical layer 1111 through the physical layer 1210. The signals provided to the physical layer 1111 may be transferred to the core dies 1120 to 1150 through the interface circuits of the physical layer 1111 and the TSVs 1101.

The memory controller 1220 may control the overall operation of the stacked memory device 1100. The memory controller 1220 may transmit signals for controlling the stacked memory device 1100 to the stacked memory device 1100 through the physical layer 1210. The memory controller 1220 may correspond to the memory controller 10 of FIG. 1.

The interposer 1300 may connect the stacked memory device 1100 and the system-on-chip 1200. The interposer 1300 may be connected between the physical layer 1111 of the stacked memory device 1100 and the physical layer 1210 of the system-on-chip 1200, and provide physical paths formed by the use of the conductive materials. As a result, the stacked memory device 1100 and the system-on-chip 1200 may be stacked on the interposer 1300 to transmit and receive signals to each other.

Bumps 1103 may be attached to the upper part of the package substrate 1400, and solder balls 1104 may be attached to the lower part thereof. For example, the bumps 1103 may be flip-chip bumps. The interposer 1300 may be stacked on the package substrate 1400 through the bumps 1103. The semiconductor package 1000 may transmit and receive signals to and from other external packages or semiconductor devices through the solder balls 1104. For example, the package substrate 1400 may be a printed circuit board (PCB).

Figure 14:
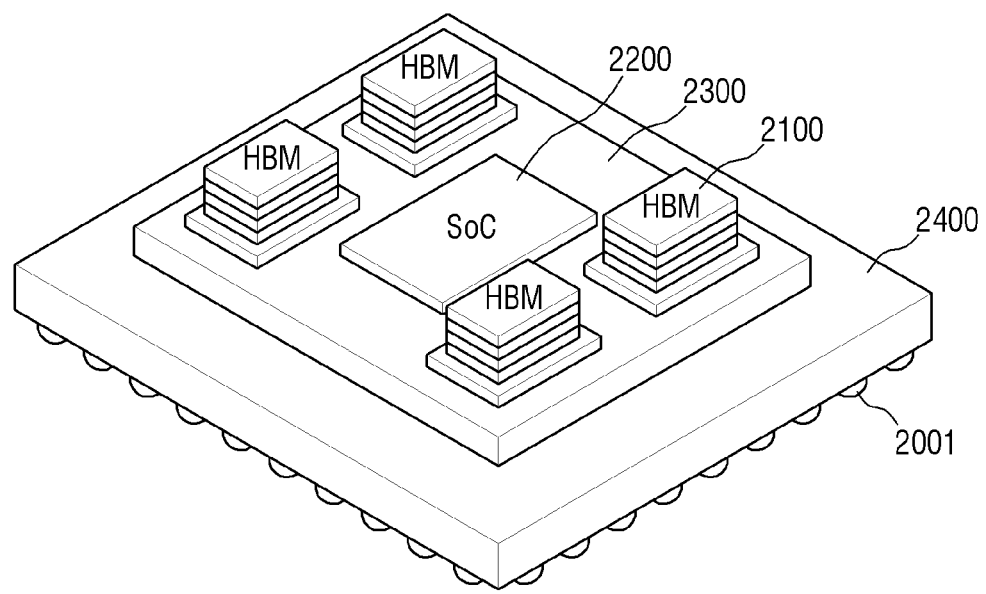
FIG. 14 illustrates a diagram of a semiconductor package according to some embodiments of the inventive concepts.

FIG. 14 illustrates a diagram of a semiconductor package according to some embodiments.

Referring to FIG. 14, a semiconductor package 2000 may include a plurality of stacked memory devices 2100 and a system-on-chip 2200. The stacked memory devices 2100 and the system-on-chip 2200 may be stacked on the interposer 2300, and the interposer 2300 may be stacked on the package substrate 2400. The semiconductor package 2000 may transmit and receive signals to and from other external packages or semiconductor devices through solder balls 2001 attached to the lower part of the package substrate 2400.

Each of the stacked memory devices 2100 may be implemented on the basis of an HBM (high bandwidth memory) standard. However, the present disclosure is not limited thereto, and each of the stacked memory devices 2100 may be implemented on the basis of a GDDR (graphics DDR), an HMC (high memory cube) or a Wide I/O standard. Each of the stacked memory devices 2100 may correspond to the stacked memory device 1100 of FIG. 13.

The system-on-chip 2200 may include at least one processor such as a CPU, an AP, a GPU, and a NPU, and a plurality of memory controllers for controlling a plurality of stacked memory devices 2100. The system-on-chip 2200 may transmit and receive signals to and from the corresponding stacked memory device through the memory controller. The system-on-chip 2200 may correspond to the system-on-chip 1200 of FIG. 13.

Figure 15:
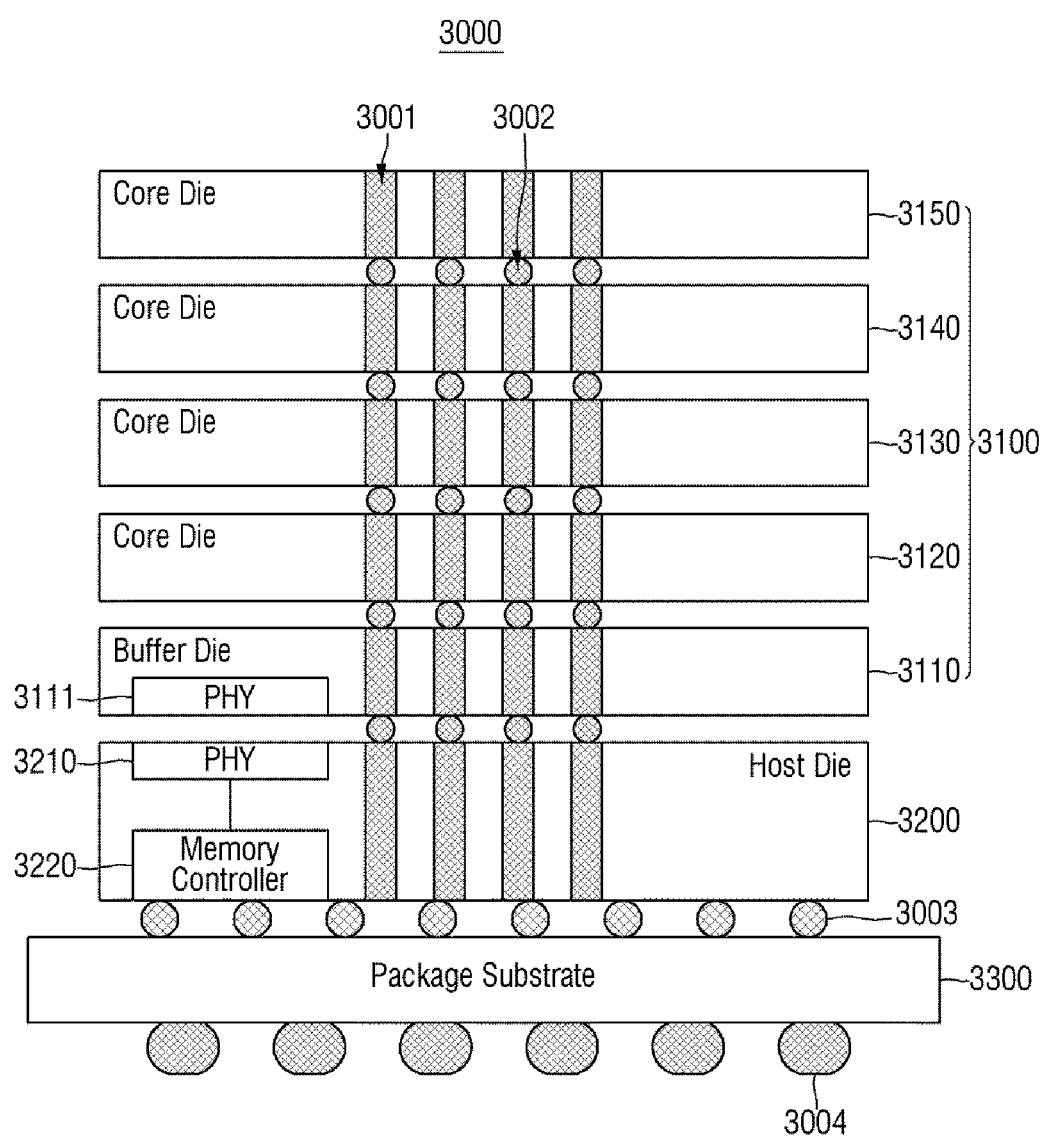
FIG. 15 illustrates a diagram of a semiconductor package according to some embodiments of the inventive concepts.

FIG. 15 illustrates a diagram of a semiconductor package according to some embodiments of the inventive concepts.

Referring to FIG. 15, the semiconductor package 3000 may include a stacked memory device 3100, a host die 3200, and a package substrate 3300. The stacked memory device 3100 may include a buffer die 3110 and core dies 3120 to 3150. The buffer die 3110 may include a physical layer 3111 for communicating with the host die 3200, and each of the core dies 3120 to 3150 may include a memory cell array. The stacked memory device 3100 may correspond to the stacked memory device of FIG. 13.

The host die 3200 may include a physical layer 3210 for communicating with the stacked memory device 3100, and a memory controller 3220 for controlling the overall operation of the stacked memory device 3100. The memory controller 3220 may correspond to the memory controller 10 of FIG. 1. Further, the host die 3200 may include a processor (not shown) for controlling the overall operation of the semiconductor package 3000 and executing the applications supported by the semiconductor package 3000. For example, the host die 3200 may include at least one processor such as a CPU, an AP, a GPU, and a NPU.

The stacked memory device 3100 may be placed on the host die 3200 on the basis of the TSV 3001 and may be stacked vertically on the host die 3200. Accordingly, the buffer die 3110, the core dies 3120 to 3150, and the host die 3200 may be electrically connected to each other through the TSVs 3001 and the bumps 3002 without an interposer. For example, the bumps 3002 may be micro bumps.

The bumps 3003 may be attached to the upper part of the package substrate 3300, and the solder balls 3004 may be attached to the lower part thereof. For example, the bumps 3003 may be flip-chip bumps. The host die 3200 may be stacked on the package substrate 3300 through the bumps 3003. The semiconductor package 3000 may transmit and receive signals to and from other external packages or semiconductor devices through the solder balls 3004.

Figure 16:
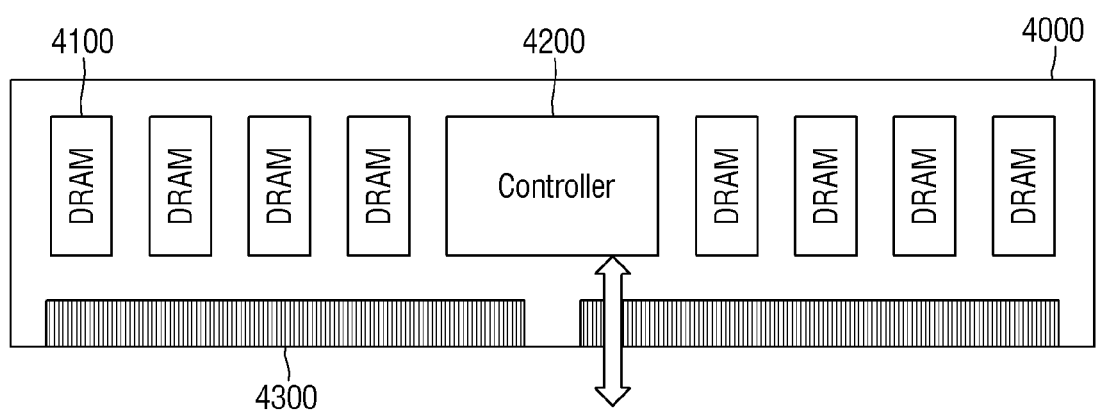
FIG. 16 illustrates a diagram of a memory module according to some embodiments of the inventive concepts.

FIG. 16 illustrates a diagram of a memory module according to some embodiments of the inventive concepts.

Referring to FIG. 16, the memory module 4000 according to some embodiments may include a plurality of memory devices 4100, a memory controller 4200, and memory I/O pins 4300. The memory module 4000 may be mounted on an electronic device. The memory module 4000 may be connected to a CPU within the electronic device (not shown).

The CPU may control the memory module 4000 according to communication protocol such as a DDR (Double Data Rate) and an LPDDR (Low Power DDR). For example, in order to read the data stored in the memory module 4000, the CPU may transmit commands and addresses to the memory module 4000.

The memory devices 4100 may write data or output the written data according to the control of the CPU. The memory devices 4100 may be at least one of a DRAM (Dynamic Random Access Memory) and an SDRAM. At least a part of the memory devices 4100 may correspond to the memory device 20 described referring to FIGS. 1 to 12.

The memory devices 4100 may perform communication of the data DQ in response to the signal provided from the memory controller 4200. According to some embodiments, the memory devices 4100 may further include data buffers (not shown) for data communication, and the data buffers (not shown) may be synchronized with a data strobe signal DQS to send and receive data DQ to and from the memory controller 4200.

The memory controller 4200 may communicate with the memory devices 4100 according to one of standards of the memory modules, such as a dual in-line memory modules (DIMM), a registered DIMM (RDIMM), a load reduced DIMM (LRDIMM), and a UDIMM according to some embodiments.

The memory controller 4200 receives a command/address CA and a clock signal CK of the memory module 4000 through the memory I/O pins 4300 according to some embodiments, and may provide the received signals to a plurality of memory devices 4100.

In concluding the detailed description, those skilled in the art should appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:

1. A memory device comprising:
   a memory bank array which includes a first edge memory block, a second edge memory block, and a plurality of memory blocks between the first edge memory block and the second edge memory block;
   a plurality of sense amplifiers disposed between the plurality of memory blocks, wherein each corresponding sense amplifier from among the plurality of sense amplifiers is connected to a first bit line of a memory block from among the plurality of memory blocks on one side of the corresponding sense amplifier and a first complementary bit line of a memory block from among the plurality of memory blocks on an other side of the corresponding sense amplifier;
   a first edge sense amplifier connected to a second bit line and a second complementary bit line of the first edge memory block;
   a second edge sense amplifier connected to a third bit line and a third complementary bit line of the second edge memory block; and
   a control logic circuit configured to store a number of times of activation of at least one of a plurality of word lines of the plurality of memory blocks, in at least a part of the first edge memory block and the second edge memory block.

2. The memory device of claim 1, wherein the control logic circuit is further configured to store the number of times of activation of each of the plurality of word lines of the plurality of memory blocks, in at least a part of the first edge memory block and the second edge memory block.

3. The memory device of claim 2, wherein the control logic circuit is configured to store the number of times of activation of each of a part of the plurality of word lines in any one memory block of the plurality of memory blocks in the first edge memory block, and to store the number of times of activation of each of a remaining part of the plurality of word lines in the second edge memory block.

4. The memory device of claim 2, wherein the control logic circuit is configured to store the number of times of activation in at least a part of the first edge memory block and the second edge memory block based on an active command for each of the plurality of word lines.

5. The memory device of claim 2, further comprising a refresh address generator configured to generate a refresh address in response to a refresh command,
   wherein the refresh address generator is configured to output the refresh address based on the number of times of activation.

6. The memory device of claim 1, wherein the control logic circuit is configured to store the number of times of activation of each of a plurality of word lines of the second edge memory block in the second edge memory block.

7. The memory device of claim 1, wherein the control logic circuit is configured to store the number of times of activation of each of a plurality of word lines of the first edge memory block in the first edge memory block.

8. The memory device of claim 1, wherein the control logic circuit is configured to store the number of times of activation of each of a plurality of word lines of a memory block adjacent to the second edge memory block in the first edge memory block.

9. The memory device of claim 1, wherein the control logic is configured to store the number of times of activation of each of a plurality of word lines of a memory block adjacent to the first edge memory block in the second edge memory block.

10. A memory device comprising:
    a plurality of memory blocks including a plurality of first word lines, and a plurality of first memory cells connected to the plurality of first word lines and that store data;
    a memory bank array including a first edge memory block and a second edge memory block including a plurality of second word lines, and a plurality of second memory cells connected to the plurality of second word lines and that stores a number of times of activation of each of the plurality of first word lines; and
    a control logic circuit configured to activate a third word line from among the plurality of first word lines corresponding to a row address of an active command, and a word line from among the plurality of second word lines to which a memory cell from among the plurality of second memory cells which stores the number of times of activation of the third word line is connected, in response to the active command,
    wherein the first edge memory block is disposed at a first edge of the memory bank array, and
    the second edge memory block is disposed at a second edge of the memory bank array.

11. The memory device of claim 10, further comprising:
    a first sense amplifier disposed between the plurality of memory blocks;
    a second sense amplifier connected to a plurality of second bit lines and a plurality of second complementary bit lines included in the first edge memory block; and
    a third sense amplifier connected to a plurality of third bit lines and a plurality of third complementary bit lines included in the second edge memory block,
    wherein the first sense amplifier connects a plurality of first bit lines of a memory block from among the plurality of memory blocks on one side of the first sense amplifier and a plurality of first complementary bit lines of a memory block from among the plurality of memory blocks on an other side of the first sense amplifier.

12. The memory device of claim 10, wherein the plurality of second memory cells store the number of times of activation of each of a part of the plurality of first word lines, and
   a plurality of third memory cells store the number of times of activation of each of a remaining part of the plurality of first word lines.

13. The memory device of claim 10, wherein the control logic circuit is configured to simultaneously activate the third word line, and a word line from among the plurality of second word lines to which a second memory cell from among the plurality of second memory cells which stores the number of times of activation of the third word line is connected.

14. The memory device of claim 13, wherein the third word line is one of the plurality of first word lines included in a memory block from among the plurality of memory blocks which is not adjacent to the first edge memory block and the second edge memory block.

15. The memory device of claim 10, further comprising a refresh address generator configured to output a refresh address in response to a refresh command,
   wherein the refresh address generator is configured to output the refresh address based on the number of times of activation.

16. A memory device comprising:
   a memory bank array including a first edge memory block, a second edge memory block, and a plurality of memory blocks between the first edge memory block and the second edge memory block; and
   a control logic circuit configured to update a number of times of activation of a word line corresponding to a row address of an active command stored in either the first edge memory block or the second edge memory block, in response to the active command,
   wherein the first edge memory block is disposed at a first edge of the memory bank array, and
   the second edge memory block is disposed at a second edge of the memory bank array.

17. The memory device of claim 16, wherein the number of times of activation is stored in the first edge memory block, and
   the control logic circuit configured to read the number of times of activation from the first edge memory block, to increase the number of times of activation read from the first edge memory block, and to write the increased number of times of activation in the first edge memory block to update the number of times of activation.

18. The memory device of claim 16, wherein a first word line corresponding to the row address is included in a memory block from among the plurality of memory blocks adjacent to the first edge memory block,
   the number of times of activation of the first word line is stored in a memory cell connected to a second word line and a second bit line of the second edge memory block, and
   the control logic circuit is configured to activate the first word line and the second word line in response to the active command.

19. The memory device of claim 16, wherein a first word line corresponding to the row address is included in a memory block from among the plurality of memory blocks which is not adjacent to the first edge memory block and the second edge memory block,
   the number of times of activation of the first word line is stored in a memory cell connected to a second word line of the first edge memory block, and
   the control logic circuit is configured to activate the first word line and the second word line in response to the active command.

20. The memory device of claim 16, wherein a first word line corresponding to the row address is included in the first edge memory block,
   the number of times of activation of the first word line is stored in a memory cell connected to the first word line of the first edge memory block, and
   the control logic circuit is configured to activate the first word line in response to the active command.

* * * * *